United States Patent
Cho et al.

(10) Patent No.: US 8,258,050 B2
(45) Date of Patent: Sep. 4, 2012

(54) METHOD OF MAKING LIGHT TRAPPING CRYSTALLINE STRUCTURES

(75) Inventors: Hans S. Cho, Palo Alto, CA (US); Theodore I. Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 504 days.

(21) Appl. No.: 12/505,377

(22) Filed: Jul. 17, 2009

(65) Prior Publication Data

US 2011/0012222 A1    Jan. 20, 2011

(51) Int. Cl.
H01L 21/20 (2006.01)
H01L 21/36 (2006.01)

(52) U.S. Cl. ............ 438/487; 438/482; 438/486; 117/8; 136/258

(58) Field of Classification Search .................. 438/482, 438/486, 487; 117/8; 136/258
See application file for complete search history.

(56) References Cited

U.S. PATENT DOCUMENTS

| | | | |
|---|---|---|---|
| 4,431,858 | A | 2/1984 | Gonzalez et al. |
| 6,184,456 | B1 | 2/2001 | Matsuyama et al. |
| 7,276,389 | B2 | 10/2007 | Kim et al. |
| 7,745,822 | B2 * | 6/2010 | Okumura ..................... 257/49 |
| 2002/0132101 | A1 | 9/2002 | Fonash et al. |
| 2004/0084407 | A1 | 5/2004 | Makarov et al. |
| 2007/0137697 | A1 | 6/2007 | Kempa et al. |
| 2008/0006319 | A1 | 1/2008 | Bettge et al. |

FOREIGN PATENT DOCUMENTS

WO    WO2006130573 A2    12/2006

OTHER PUBLICATIONS

Tao, Meng, Inorganic Photovoltaic Solar Cells: Silicon and Beyond, The Electrochemical Society Interface, Winter 2008, pp. 30-35.
J. S. Im et al., Controlled Super-Lateral Growth of Si Films for Microstructural Manipulation and Optimization, Phys. Stat. Sol. (a) (1998) pp. 603-617, 166.
Mitsutoshi Miyasaka et al., In Situ Observation of Nickel Metal-Induced Lateral Crystallization of Amorphous Silicon Thin Films, Applied Physics Letters, Feb. 11, 2002, pp. 944-946, vol. 80, No. 6.
Jae Hwan Oh et al., Growth of (100)-Oriented Polycrystalline Si Film by Ni-Mediated Crystallization of Tin Amorphous Silicon, Journal of the Electrochemical Society, 2006, pp. G12-G15, 153 (1).
A. Polman et al., Pulsed-laser Crystallization of Amorphous Silicon Layers Buried in a Crystalline Matrix, J. Appl. Phys., May 1, 1990, pp. 4024-4035, 67 (9).

(Continued)

*Primary Examiner* — Kevin M Picardat
*Assistant Examiner* — Bac Au

(57) ABSTRACT

A method of making a crystalline semiconductor structure provides a photonic device by employing low thermal budget annealing process. The method includes annealing a non-single crystal semiconductor film formed on a substrate to form a polycrystalline layer that includes a transition region adjacent to a surface of the film and a relatively thicker columnar region between the transition region and the substrate. The transition region includes small grains with random grain boundaries. The columnar region includes relatively larger columnar grains with substantially parallel grain boundaries that are substantially perpendicular to the substrate. The method further includes etching the surface to expose the columnar region having an irregular serrated surface.

18 Claims, 6 Drawing Sheets

OTHER PUBLICATIONS

Soo Young Yoon et al., Low Temperature Metal Induced Crystallization of Amorphous Silicon Using a Ni Solution, J. Appl. Phys. Dec. 1, 1997, pp. 5865-5867, 82 (11).

H. Oppolzer et al., Microstructure and Sheet Resistance of Phosphorus-implanted Annealed Polycrystalline Silicon Films, Inst. Phys. Conf., Apr. 1981, pp. 283-288, Ser. No. 60, Section 6.

M.T. Duffy et al., LPCVD Polycrystalline Silicon: Growth and Physical Properties of Diffusion-Doped, Ion-Implanted, and Undoped Films, RCA Review, Jun. 1983, pp. 313-325, vol. 44.

D. Meakin et al., Structural Studies of Low-Temperature Low-Pressure Chemical Deposited Polycrystalline Silicon, J. Appl. Phys., Jun. 1, 1987, pp. 5031-5037, vol. 61, No. 11.

Y.Z. Wang, et al., Polycrystalline Silicon Thin Films Formed by Metal-induced Solid Phase Crystallization of Amorphous Silicon, J. Vac. Sci. Technol. A, Nov./Dec. 1998, pp. 3352-3358, vol. 16, No. 6.

Oliver Nast et al., Aluminum-induced Crystallization of Amorphous Silicon on Glass Substrates Above and Below the Eutectic Temperature, Appl. Phys. Lett., Nov. 30, 1998, pp. 3214-3216, vol. 73, No. 22.

\* cited by examiner

METHOD OF MAKING LIGHT TRAPPING CRYSTALLINE STRUCTURES

CROSS-REFERENCE TO RELATED APPLICATIONS

N/A

STATEMENT REGARDING FEDERALLY SPONSORED RESEARCH OR DEVELOPMENT

N/A

BACKGROUND

High performance semiconductor devices, especially those with p-n junctions, are historically made with single-crystal semiconductor materials. The use of such single-crystal materials for semiconductor devices effectively avoids charged carrier scattering and minority carrier recombination when compared to using non-single crystal semiconductor materials that have grain boundaries. The scattering of charge carriers adversely reduces the drift mobility and the diffusion of the charged carriers, which leads to degraded performance of devices, such as photonic devices. Recombination leads to rapid loss of minority carriers, further degrading the performance of devices that rely on minority carriers. Degraded performance is manifested by increased resistance and a decrease in optical to electrical conversion efficiency, for example. Even when different semiconductor materials were employed together in a semiconductor device, such as in a heterostructure or heterojunction device, single-crystal semiconductor materials are generally chosen based on their respective lattice structures. This is to insure that the realized structure is effectively a single-crystal structure as a whole. Similarly, nanostructures including, but not limited to, nanowires and nanodots are typically nucleated and grown from single-crystal substrates, in part to capitalize on the uniform nature of the lattice of such substrates that provides required crystallographic information for the nanostructures to be aligned.

Photovoltaic cells are one type of photonic device that are the subject of much interest due to high energy costs and U.S. dependence on fossil fuel from foreign sources. Photodetectors are another type of photonic device of particular interest. The efficiency and quality of photovoltaic cells have improved significantly over the last 10 years. Efforts to lower the cost of photovoltaic cells have been directed at alternative materials and manufacturing methods.

Amorphous and other non-single crystal semiconductor materials, such as polycrystalline semiconductor materials, have attracted attention at least for potential cost savings in photovoltaic applications. While having the disadvantage of lower efficiencies that are associated with one or both of multiple grain boundaries and unfavorable carrier transport and lifetime in the non-single crystal semiconductor materials, such materials can be considerably cheaper to manufacture than their single-crystal counterparts. There are applications where the lower cost of producing the semiconductor device from non-single crystal materials may outweigh any loss of performance that may result. However, this trade-off is simply not an option for many photonic applications.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
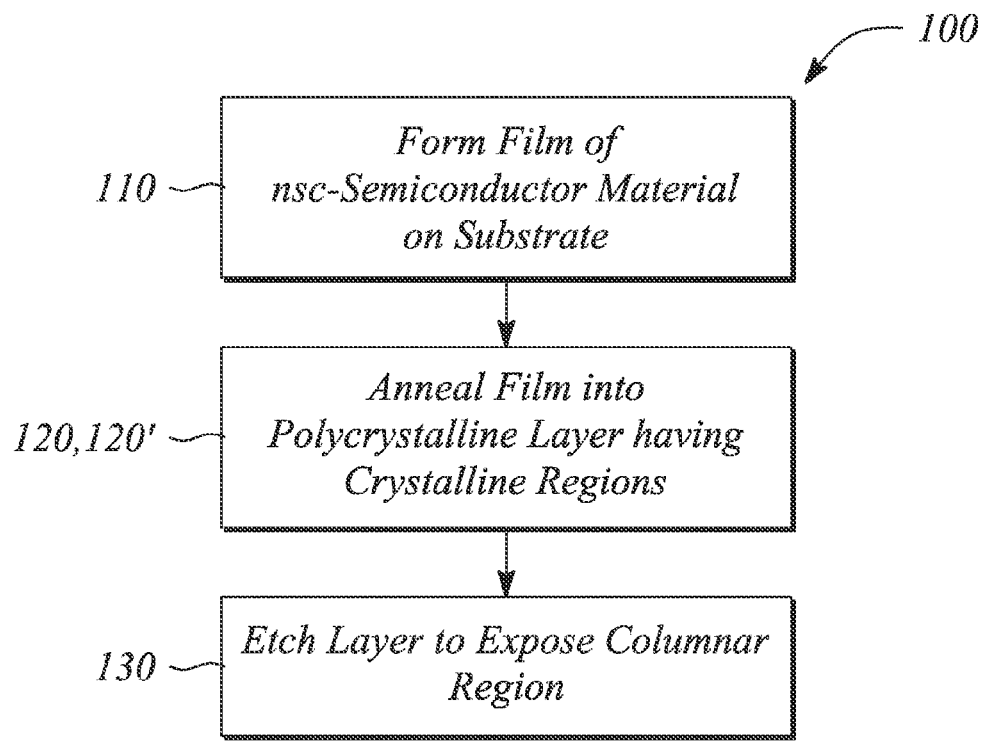
FIG. 1 illustrates a flow chart of a method of making a light trapping crystalline semiconductor structure, according to an embodiment of the present invention.

Embodiments of the present invention employ low cost, non-single crystal semiconductor materials and low cost substrates to fabricate a light trapping crystalline semiconductor structure with a high degree of crystallinity for photonic applications, such as photodetection and photovoltaics. In particular, a method of making the crystalline semiconductor structure uses a low thermal budget annealing process. The low thermal budget annealing process includes one or both of crystallization and recrystallization of a semiconductor material according to the present embodiments. The 'low thermal budget annealing process' also will be referred to as 'annealing' or 'annealing process' for simplicity of discussion unless a specific embodiment is being described. The annealing process converts low cost amorphous semiconductor or fine-grained polycrystalline semiconductor films into a polycrystalline layer that has different crystalline regions; at least one of the crystalline regions is distinguishable from fine-grain polycrystalline. After etching the polycrystalline layer, a crystalline semiconductor structure with limited defects remains; these defects are positioned to reduce their interference with device operation. The crystalline semiconductor structure has an irregular serrated surface and large columnar grains that are predominantly single-crystal. In some embodiments, the low cost substrate is also a low-temperature substrate that is compatible with the low thermal budget annealing process.

The method of making a crystalline semiconductor structure and photonic devices made using the method according to the present embodiments differs from a co-pending International Patent Application No. PCT/US09/42403, filed Apr. 30, 2009 in that some of the present embodiments remove a grain boundary-rich region (i.e., 'transition region') that is otherwise adjacent to a substrate electrode of the photonic device of the co-pending application. Moreover, the method of making according to some of the present embodiments forms the large columnar grains directly adjacent to the substrate. As a result, a photonic device made using the method of the present embodiments has lower series resistance at the electrode on the substrate surface due to the adjacent large columnar grains. In some embodiments, photonic devices made using the light trapping crystalline semiconductor structure of the present invention provide solar energy conversion efficiency comparable to single-crystal semiconductor devices but at a lower cost.

In accordance with the various embodiments, a thick polycrystalline layer having different crystalline regions is formed on a substrate, for example a low-temperature substrate, as defined below, by using the low thermal budget annealing process on a non-single crystal semiconductor film deposited on the substrate. The substrate may comprise an electrode on its surface for the fabrication of a photonic device. The thick polycrystalline layer has a transition region adjacent to a surface of the polycrystalline layer and a columnar region anchored between the transition region and the substrate. The transition region is defined as a region that comprises small grains and random grain boundaries that are oriented in a variety of directions. The columnar region is defined as a region that comprises relatively much larger predominantly single-crystal grains of different widths that are separated by grain boundaries that have a relatively uniform columnar alignment. In other words, the columnar grain boundaries that define the relatively larger grains of the columnar region are substantially parallel to one another. Moreover, the columnar grain boundaries are substantially perpendicular to a major plane of the substrate.

During the low thermal budget annealing process, the transition region forms first at the surface of the layer followed by the columnar grains of the columnar region that extend from the transition region to the substrate. The columnar grains are formed from certain grains of the transition region that dominate other grains and develop preferentially during the annealing process, thus constituting a majority of a subsequently crystallized volume of the film in the adjacent region. After etching, a crystalline semiconductor structure on a substrate results that has an irregular serrated surface. The crystalline semiconductor structure may be used to fabricate various photonic devices with improved light trapping capability and efficiency. For example, an active region of the device that conforms to the contours of the irregular serrated surface improves light trapping and absorption capability. Moreover, the large columnar grains adjacent to a substrate electrode have lower series resistance with the substrate electrode.

The method of making according to various embodiments of the present invention removes the transition region at the surface of the polycrystalline layer to expose the columnar region. In particular, the method of making comprises preferentially etching grain boundaries, which are predominant in the transition region, such that the transition region is substantially removed and an irregular serrated surface of the columnar region is exposed. The preferential etching may be continued to further etch along the grain boundaries of a portion of the columnar region to accentuate the irregular serrated surface inherently provided by the present embodiments of the method of making. The crystalline semiconductor structure also may be thought of as a plurality of adjacent columnar grains tapered at a top end and delineated by respective columnar grain boundaries remaining at a base end.

The 'light trapping crystalline semiconductor structure' is defined as the herein-described adjacent columnar grains that provide the structure with the irregular serrated surface and will be referred to as the 'crystalline semiconductor structure' for simplicity of discussion only. The individual columnar grains of the crystalline semiconductor structure are predominantly single-crystal (and the columnar region is a plurality of these columnar grains). By 'predominantly single-crystal,' it is meant that a columnar grain may be either a single-crystal grain throughout or may further comprise a minor or negligible grain boundary in addition to the substantially parallel grain boundary that delineates adjacent columnar grains from one another in the crystalline semiconductor structure. The minor grain boundary, when present, has a small adverse effect on an active region of a photonic device made therewith. The crystalline semiconductor structure is effectively an array of vertically aligned tapered columnar predominantly single-crystal grains. The columnar grains of the crystalline semiconductor structure have a variety of wide bases and relatively narrow tapered top ends. As mentioned above, the wide bases adjacent to the substrate provide less contact resistance between the columnar grain and a substrate electrode in photonic applications. Moreover, the irregular serrated surface at the top end provides greater surface area for a conformal active region and potentially greater light trapping ability than a relatively uniform surface or a flat surface.

In some embodiments, a method of making a light trapping semiconductor or photonic device is provided. The method of making the device includes the method of making a crystalline semiconductor structure and further forms electrodes and an active region comprising a semiconductor junction that conforms to the irregular serrated surface of the exposed columnar region. A top electrode is provided in electrical contact with a surface region of the conformal semiconductor junction. A bottom electrode is formed on the substrate surface and is between the substrate and the crystalline semiconductor structure. The bottom electrode is in electrical contact with the base end of the columnar grains of the crystalline semiconductor structure.

The methods of making a crystalline semiconductor structure and a light trapping semiconductor or photonic device are particularly suited for making photonic devices on low-temperature, low cost substrates and are compatible with current semiconductor fabrication techniques. In some embodiments, the method does not introduce metal impurities (e.g., such as from metal-catalyzed growth techniques) into the active region of the tapered structures. In other embodiments, any potential electrical effects caused by using a metal catalyzed crystallization process are reduced, or in some embodiments minimized, with a choice of a less detrimental metal material and techniques, such as gettering techniques, that remove the metal after crystallization or move it to noncritical regions of the device being fabricated, for example.

The irregular serrated surface may comprise one or more of a point, curve, plateau and ridge, for example. The tapered portion of the columnar grains of the crystalline semiconductor structure may be one or more of conical, an asymmetrical cone shape, pyramidal, an asymmetrical pyramid shape and other polyhedral shapes, depending on the embodiment. In plan view, the columnar grains are one of circular, elliptical and polygonal and combinations of these shapes. In various embodiments of the present invention, the columnar grains of the crystalline semiconductor structure generally possess a height to base width ratio that is large, for example 2:1 or larger. In some embodiments, the ratio of height to base width may be 20:1 or larger.

The substrate material may be any material that can maintain thermal stability during the processing temperatures and conditions of the various embodiments of the method of making the crystalline semiconductor structure and the light trapping semiconductor device described herein. Such temperatures include those used for deposition of a semiconductor film, forming electrodes and forming a conformal semiconductor junction, depending on the embodiment. In some embodiments, the substrate is a 'low-temperature substrate' material, which is defined herein as a substrate material that has a low damage threshold temperature or a low tolerance to thermal exposure, which may be defined herein as melting temperature or warping temperature. For example, glass is a low cost, large-area substrate material with a damage threshold temperature that depends on the type of glass. Some types of glass have a damage threshold temperature of less than or equal to about 500° C. Substrate materials with a low damage threshold temperature are also low cost, for example.

In some embodiments, the substrate material is transparent to a wavelength of a laser pulse. For example, the substrate may be transparent to a wavelength in one or more of the ultra-violet (UV) range, visible (Vis) range and infra-red (IR) range of the electromagnetic spectrum. In some embodiments, the substrate is a material selected from a glass, a plastic, an organic polymer, an inorganic polymer, a metal, a metal alloy, a ceramic, a dielectric and a semiconductor, including low-temperature ones of any of these. In some embodiments, the substrate material may be any of rigid, semi-rigid or flexible. Moreover, the substrate may exhibit one or more of the following characteristics: thermally conductive, electrically conductive, refractive, reflective, opaque, and optically transparent, depending on the embodiment of the method of making and on the embodiment of the light trapping semiconductor device made.

A 'large area substrate' is a non-single crystalline substrate that is manufactured without expensive semiconductor wafer fabrication technology such that the substrate can be larger than current circular wafers that have a diameter of about 20 centimeters (cm) or even about 30 cm, for example. By 'non-single crystalline' or 'non-single crystal,' it is meant that the substrate material may be one or more of amorphous, microcrystalline and polycrystalline. For example, glass is an inexpensive, amorphous material that also provides optical transparency useful for some embodiments of the present invention. In some embodiments, the size of the large area substrate may be larger than that of flat screen television displays, for example.

The annealing process according to the various embodiments herein is a low thermal budget process that maintains an effective maximum temperature of the substrate below the damage threshold temperature. A 'damage threshold temperature' is defined herein as a temperature above which the substrate deforms in the time that the substrate is near the maximum temperature reached during the annealing process, which as mentioned above, includes one or both of crystallization and recrystallization of a semiconductor material that is on the substrate. The effective maximum temperature allowed depends on whether and which low-temperature substrate material may be used for making the crystalline semiconductor structure. In some embodiments, an effective maximum temperature of the substrate during the annealing process may not exceed 450° C. for some low-temperature substrates. In some embodiments, the effective maximum temperature of the substrate may not exceed 400° C., for example, or may not exceed 500° C., for example, or may not exceed 600° C., for example, depending on the substrate material. In some embodiments, such as those utilizing a pulsed laser annealing method, a thin portion of the substrate adjacent to the semiconductor region being annealed may be subjected to heating temperatures above the damage threshold for very short periods of time, such as a few microseconds, as the heat dissipates from the annealed semiconductor, but this does not result in deformation or other damage to the substrate due to its extremely short duration. In some embodiments, the substrate comprises a thin layer of an insulating material on a surface of the substrate, for example a thin layer of $SiO_2$. Reference herein to the 'substrate' includes within its scope a substrate having a thin layer of insulating material thereon.

According to some embodiments, the temperature of the semiconductor during the annealing process may reach 1400° C. or more, for example, for a very short period of time, depending on the semiconductor material being used to form the crystalline semiconductor structure. In some embodiments, annealing comprises a pulsed laser annealing process that includes high temperature to melt the semiconductor film for a short period of time that ranges from several nanoseconds to several hundred nanoseconds, or in some embodiments, as much as several microseconds. The high temperature used depends on the precursor semiconductor material chosen for the film and whether the precursor material is amorphous or polycrystalline, for example. As such, the pulsed laser annealing process includes one or both of crystallization and recrystallization, depending on precursor film material used.

In other embodiments, annealing comprises a metal catalyzed thermal crystallization process that heats the film at a lower temperature and for a longer period of time relative to the pulsed laser process. Moreover, the metal catalyzed thermal crystallization process is used to crystallize a film material that is an amorphous semiconductor. In some embodiments, the temperature during the metal catalyzed thermal crystallization process may not exceed 500° C., for example, depending on the semiconductor material, and is maintained for a period of time ranging from about 30 minutes to about 10 hours. In some embodiments, the temperature ranges from about 300° C. to about 500° C. for a period of time ranging from about 1 hour to about 8 hours. In any of these embodiments, the effective maximum temperature of the substrate during the crystallization process is much lower than any high temperature reached by the semiconductor material during the pulsed laser annealing process, which may exceed 1400° C. for example.

The term 'extrinsic semiconductor' is defined as a semiconductor material that is intentionally doped with either a p-type dopant or an n-type dopant to provide a higher level of electrical conductivity to the semiconductor material than the semiconductor inherently has. The term 'extrinsic region' is a region of the extrinsic semiconductor. The term 'intrinsic semiconductor' is defined as a semiconductor material that is one or more of undoped, lightly doped, and not intentionally doped with a dopant material. The term 'intrinsic region' is a region of the intrinsic semiconductor. By 'lightly doped' and 'not intentionally doped' (or 'unintentionally doped'), it is meant that a relatively small amount of dopant may be incorporated in the intrinsic semiconductor, for example as a result of one or both of diffusion of dopants and unintentional doping from an adjacent extrinsic semiconductor. The relatively small amount of dopant is a very low concentration of dopant, for example approximately $10^{15}$ per cubic centimeter or less, relative to an extrinsically doped semiconductor, which may have $10^{17}$ per cubic centimeter of dopant or higher, for example.

According to the various embodiments herein, the light trapping semiconductor device comprises a semiconductor junction. The term 'semiconductor junction' means one or more layers of materials or regions of the material layers that form one of a p-n junction, a p-i-n junction, and a Schottky junction as well as any combination of said junctions layered or stacked on top of one another to form a multilayer semiconductor or semiconductor-metal junction, for example. In some embodiments, the semiconductor junction is a conformal semiconductor junction. By 'conformal,' it is meant that the respective layer(s) of the junction conforms to the shape or topography of the irregular serrated surface of the crystalline semiconductor structure. In some embodiments, the conformal semiconductor junction comprises a Schottky junction that may include a lightly doped semiconductor layer adjacent to a metal layer. In other embodiments, the conformal semiconductor junction comprises one or more conformal layers of junction material to form p-n junctions and p-i-n junctions. The p-n junction and the p-i-n junction are provided by selectively doping one or both of the crystalline semiconductor structure and one or more conformal layers of the junction materials on the crystalline semiconductor structure. Moreover, in some embodiments, the semiconductor material of the crystalline semiconductor structure is doped when the film of the non-single crystal semiconductor material is formed on a substrate before the low thermal budget annealing process. In some embodiments, one or more of the layers of junction material may be doped during deposition of the respective junction layers as well.

In some embodiments, the semiconductor junction is formed without adding conformal layers of junction material to the irregular serrated surface. For example, a surface region of the crystalline semiconductor structure may be converted from one conductivity type to an opposite conductivity type.

In another example, a p-n semiconductor junction may comprise a crystalline semiconductor structure that is an extrinsic semiconductor region having a p-type dopant; and a semiconductor layer or region on the crystalline semiconductor structure that is an extrinsic semiconductor region having an n-type dopant. In another example, a p-i-n semiconductor junction may comprise the p-doped crystalline semiconductor structure as described above; a first semiconductor layer or region on the crystalline semiconductor structure that is an intrinsic semiconductor region; and a second semiconductor layer or region on the first semiconductor layer or region that is an extrinsic semiconductor region having an n-type dopant. In another example of the p-i-n semiconductor junction, the semiconductor junction may comprise the p-doped crystalline semiconductor structure as described above; a first semiconductor layer or region on the crystalline semiconductor structure that is a heavily doped p+-type layer or region; a second semiconductor layer or region that is an intrinsic semiconductor region; and a third semiconductor layer or region on the second semiconductor layer that is an extrinsic semiconductor region having an n-type dopant. In another example, a conformal Schottky semiconductor junction may comprise the crystalline semiconductor structure that is or comprises an intrinsic (i.e., lightly doped) region or moderately doped region having either a p-type dopant or n-type dopant; and a conformal conductive metal layer on the crystalline semiconductor structure adjacent to the intrinsic region.

In some embodiments, a conformal semiconductor junction comprises an additional semiconductor layer directly on the crystalline semiconductor structure that has the same conductivity type as the crystalline semiconductor structure. The other layers of the respective conformal semiconductor junction are formed directly on this additional semiconductor layer. The additional semiconductor layer (having the same conductivity type as the crystalline semiconductor structure) may move a depletion region of the semiconductor junction away from one or both of the crystalline semiconductor structure and an interface with the crystalline semiconductor structure, either of which may have a crystal defect, for example. A crystal defect might detrimentally affect the efficiency of the semiconductor junction to generate and collect charge carriers. In some embodiments, the additional semiconductor layer moves the depletion region away from the ends of the columnar grain boundaries that are adjacent to the surface of the crystalline semiconductor structure in order to improve the semiconductor junction efficiency.

Moreover, the level of doping in each layer, region or structure may be the same or different, depending on the embodiment. The variation in dopant level may yield a dopant gradient, for example. In an example of differential doping, the substrate surface may be heavily doped to yield a p+ region relative to the p region of the crystalline semiconductor structure. The heavier doping provides a lower resistivity within the substrate surface. It should be noted that the dopant types may be reversed in any of the examples herein and still be within the scope of the embodiments.

The photonic device made using the light trapping crystalline semiconductor structure may comprise a heterostructure or a heterojunction, according to some embodiments. For example, semiconductor materials having differing band gaps may be employed to respectively realize the crystalline semiconductor structure and the conformal semiconductor layer(s) of the semiconductor junction. The photonic device that comprises such differing materials is termed a heterostructure photonic device. Further, according to some embodiments, the photonic device may be a hetero-crystalline photonic device. The term 'hetero-crystalline' is defined herein as a structure comprising at least two different types of structural phases. For example, a photonic device that comprises a microcrystalline substrate surface and the crystalline semiconductor structure of adjacent predominantly single-crystal grains, according to some embodiments, is a hetero-crystalline photonic device.

The semiconductor materials used for the structures and layers of the photonic device, according to some embodiments, are independently selected from a semiconductor or a compound semiconductor composed of Group IV elements (e.g., Si, Ge, SiGe), a compound semiconductor composed of elements from Group III and Group V (e.g., GaAs, InP, InGaAs, AlGaAs, GaP), and a compound semiconductor composed of elements from Group II and Group VI (e.g., ZnO, CdS, CdSe). Therefore, the crystalline semiconductor structure may be the same as or a different semiconductor material as the semiconductor junction. For example, the substrate may be glass, the crystalline semiconductor structure may be silicon (Si) and the conformal semiconductor junction layer may comprise a single-crystal aluminum gallium arsenide (AlGaAs). In another example, the crystalline semiconductor structure may be silicon, while the conformal semiconductor junction may comprise germanium (Ge) or an alloy of silicon and germanium.

In some embodiments, concomitant with a choice of the semiconductor materials independently used in the photonic device is a respective energy band gap of the respective materials. In some embodiments, the energy band gap of the crystalline semiconductor structure may be different from the energy band gap of the conformal semiconductor layer of the semiconductor junction (a heterojunction). Moreover, one or more different semiconductor materials with different energy band gaps may be used for the various extrinsic and intrinsic regions of the conformal semiconductor junction or between the crystalline semiconductor structure and the conformal semiconductor junction.

The electrode material of the first and second electrodes is an electrically conductive material selected from a highly doped semiconductor, a metal, a metal alloy, a metal oxide. In some embodiments, the electrode material is also optically transparent or formed in such a thin layer that it is effectively optically transparent while retaining sufficient electrically conductivity for proper operation of the photonic device. In some embodiments, the electrode material may be a metal that includes, but is not limited to, gold, silver, platinum, palladium, tin, aluminum and copper. In some embodiments, the electrode material is a conductive oxide, which may or may not also be a semiconductor; the conductive oxide including, but is not limited to, indium tin oxide (ITO) and zinc oxide (ZnO), both of which are also optically transparent. In other embodiments, the electrode material is a silicide or a germanide that includes, but is not limited to, platinum silicide (PtSi) or platinum germanide (PtGe).

In a Schottky junction, the metal material of the metal-semiconductor junction has rectifying properties that are suitable for use as a diode, for example. Moreover, the metal material has charge transfer compatibility with the semiconductor material at the metal-semiconductor junction. In some embodiments, the metal material of the Schottky junction includes, but is not limited to, one or more of gold, platinum, palladium and aluminum. In addition, metal materials such as, one or more of silver, tin and copper may be used, depending on the semiconductor material of the Schottky junction.

The term 'optically transparent' is defined herein as being either transparent or semi-transparent to electromagnetic radiation, in whole or in part, in one or more of visible, UV and IR spectrums. For example, the term includes a spectral band within one or more of these spectrums.

Further, as used herein, the article 'a' or 'an' is intended to have its ordinary meaning in the patent arts, namely 'one or more'. For example, 'a columnar grain' generally means one or more columnar grains and as such, 'the columnar grain' means 'the columnar grain(s)' herein. Also, any reference herein to 'top', 'bottom', 'upper', 'lower', 'up', 'down', 'left' or 'right' is not intended to be a limitation herein. Moreover, examples herein are intended to be illustrative only and are presented for discussion purposes and not by way of limitation.

In some embodiments of the present invention, a method of making a crystalline semiconductor structure is provided. The crystalline semiconductor structure has an irregular serrated surface that facilitates light trapping at the surface. FIG. 1 illustrates a flow chart of a method 100 of making a crystalline semiconductor structure according to an embodiment of the present invention. The method 100 of making comprises forming 110 a film of a non-single crystal semiconductor material on a substrate. In some embodiments, the film is about one half micron thick to about ten microns thick. In some embodiments, the film is several microns thick to several tens of microns thick (e.g., 20 microns to 80 microns). In some embodiments, the film is extrinsically doped when formed 110, in other embodiments, the film may be undoped when formed or intrinsically doped when formed. The film is formed on a horizontal plane of the substrate, for example.

The substrate may be a large area substrate, as defined above, which means the substrate size and material is not limited by wafer fabrication technology that is one or both of expensive and size-limiting. In some embodiments, the substrate is also a low-temperature substrate, also as defined above. In some embodiments the substrate may comprise an electrode on its surface and the semiconductor film covers the substrate surface and the electrode.

In some embodiments, forming 110 a film comprises using a chemical vapor deposition technique to grow the film, for example, thermally activated chemical vapor deposition (CVD) or plasma enhanced chemical vapor deposition (PECVD), depending at least partially on the substrate material used and the material being deposited. The non-single crystal semiconductor film is a precursor or starting material for making the crystalline semiconductor structure. In some embodiments, the non-single crystal semiconductor film is an amorphous semiconductor, and in other embodiments, the non-single crystal semiconductor film is a fine-grained polycrystalline semiconductor. In some embodiments, the film is one or both of cleaned and de-gassed after it is formed 110 to remove residual contaminants and included gases, for example, before further processing. For example, Si-based films may include one or more of hydrogen gas and other gases after the film is formed (e.g., by deposition). The gases may cause sudden delamination of the film under rapid heating, such as is encountered during the pulsed laser annealing process using, due to the formation and expansion of gas bubbles that cause eruption of the film material. The gases may be gradually and safely removed (i.e., 'de-gassed'), by low-temperature annealing with slow heating (e.g., to a temperature of about 300° C. to about 400° C.) in a controlled environment, for example.

The method 100 of making further comprises annealing 120, 120' the film with a low thermal budget process of one or both of crystallization and recrystallization to convert the film into a polycrystalline layer having distinguishable crystalline regions, as further defined below. In some embodiments, annealing 120 the film comprises using pulsed laser annealing 120. Pulsed laser annealing 120 comprises irradiating the film through a backside of the substrate using a short laser pulse. In these embodiments, the substrate is optically transparent to a wavelength of the laser light. The wavelength of the laser light is chosen such that the laser light is both transmitted through the substrate and absorbed by the non-single crystal semiconductor film on the substrate. In some embodiments, the wavelength of the laser light is within the ultra-violet (UV) range of the electromagnetic spectrum. In some embodiments, the wavelength is within the range from the UV range to the visible range of the spectrum. For example, the wavelength of the laser light may be within the range from about 200 nanometers (nm) to about 750 nm. The pulse is a time-varying pulse having a pulse length that ranges from several nanoseconds to several hundred nanoseconds in some embodiments, or several microseconds in some embodiments. For example, the intensity of the laser pulse may be one of a Gaussian, a semi-Gaussian, a top hat and a spike shaped pulse as a function of time. In these embodiments, the substrate further has a thermal conductivity that is much less than that of the semiconductor material of the film.

Figure 2A:
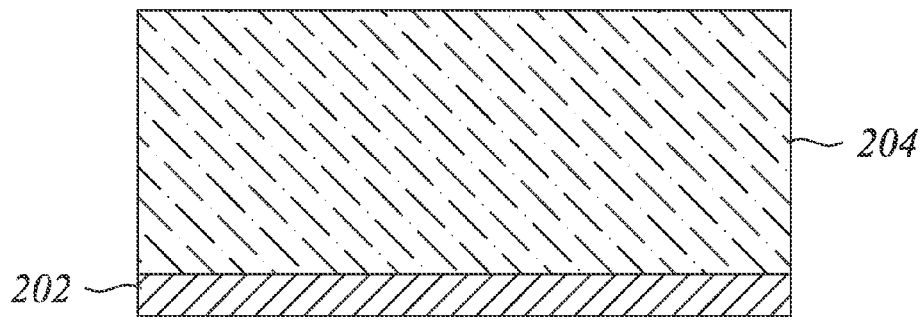
FIGS. 2A-2E illustrate cross sectional views of a portion of a crystalline structure being fabricated in accordance with pulsed laser crystallization, according to an embodiment of the present invention.
Figure 2B:
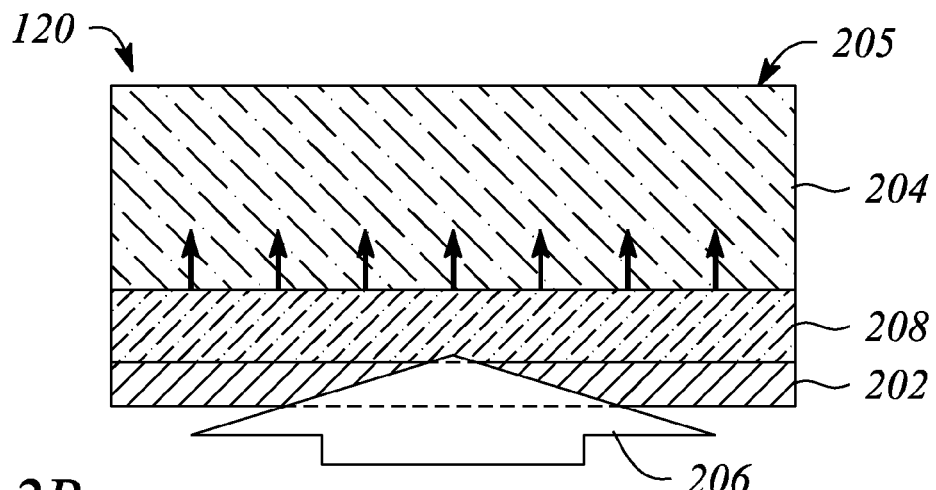

FIGS. 2A-2E illustrate cross sectional views of a portion of a crystalline semiconductor structure being fabricated in accordance with pulsed laser annealing 120, according to an embodiment of the present invention. In FIG. 2A, a substrate 202 is illustrated with a thick film 204 of a non-single crystal semiconductor material, for example an amorphous semiconductor, such as silicon (a-Si) on a glass substrate. FIG. 2B illustrates a laser light pulse 206, for example a UV laser pulse, that is directed at a backside of the substrate 202, wherein the backside of the substrate is a side opposite to a side on which the amorphous semiconductor film 204 is formed 110. During a leading edge of the laser pulse 206, the heat from the pulse causes a region 208 of the amorphous semiconductor film 204 adjacent to the substrate 202 to crystallize into a fine-grained polycrystalline material, for example, during the first few nanoseconds of the pulse 206. The crystallization produces its own heat energy that facilitates propagation of the fine-grained polycrystalline region 208 (vertical arrows) toward the surface 205 of the film 204 and away from the substrate until the amorphous semiconductor film 204 is substantially crystallized to fine-grained polycrystalline semiconductor 208.

Figure 2C:
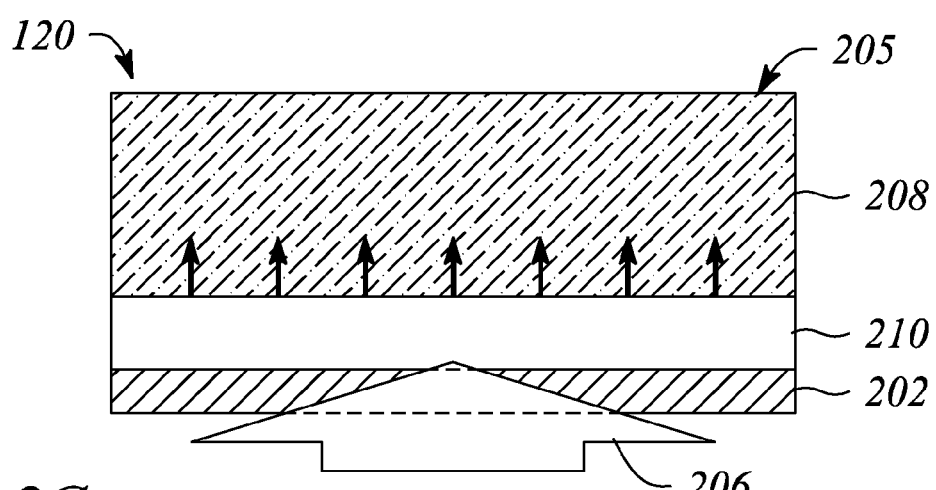
Figure 2D:
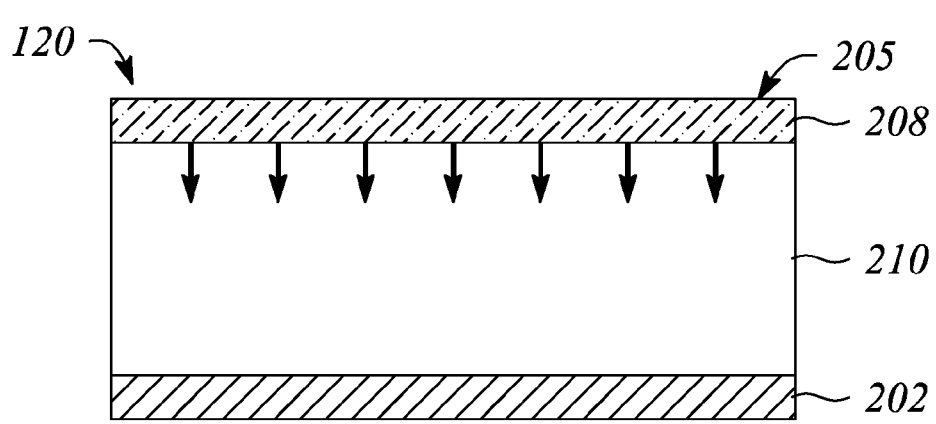

During an arrival of a following portion of the pulse 206, the fine-grained polycrystalline semiconductor region 208 begins to melt in a region adjacent to the substrate 202. FIG. 2C illustrates a melt region 210 adjacent to the substrate 202 with a melt direction (vertical arrow) away from the substrate 202 and toward the film surface 205. The melt region 210 propagates toward the surface 205 until at least major portion of the fine-grained polycrystalline semiconductor material 208 is melted, depending on the pulse 206 length. In some embodiments, the pulse length is such that the melt region 210 extends from the substrate 202 to include all but a relatively thin continuous region 208 of the fine-grained polycrystalline semiconductor, as illustrated in FIG. 2D. In other embodiments (not illustrated), the portion melted during the following portion of the pulse 206 is all of the fine-grained polycrystalline semiconductor material 208.

Figure 2E:
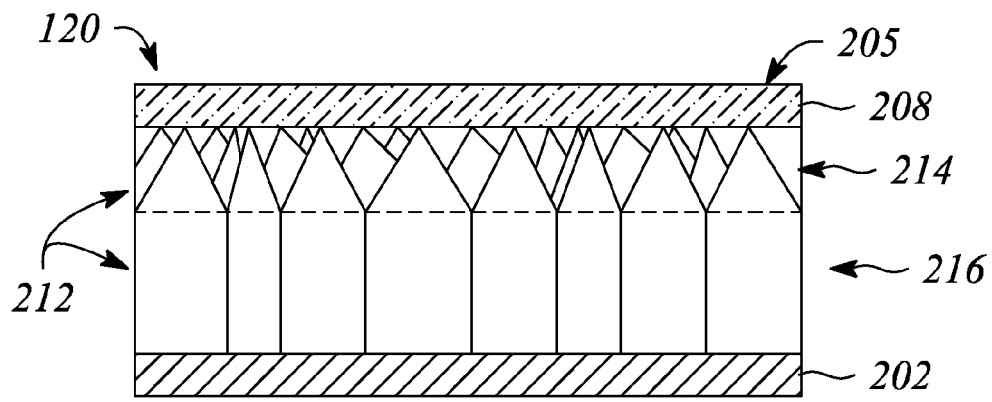

Moreover, a large thermal gradient is created between the semiconductor material, which was heated and melted by the laser pulse 206, and the underlying substrate 202. The thermal gradient facilitates spontaneous cooling of the melt region 210. Also illustrated in FIG. 2E by a vertical arrow is that cooling causes resolidification or crystal regrowth (i.e., 'recrystallization') of the melt region 210 in a direction away from the relatively thin region 208 of the fine-grained polycrystalline semiconductor at the surface 205 (when present). In particular, the fine-grained polycrystalline semiconductor region 208 is a seed layer that initiates crystal regrowth toward the substrate 202. FIG. 2E illustrates a polycrystalline layer 212 between the fine-grained polycrystalline region 208 at the surface 205 and the substrate 202. The polycrystalline layer 212 has a transition region 214 and a columnar region 216 that is anchored between the transition region 214 and the substrate 202. The transition region 214 and the columnar region 216 are as defined above.

During crystal regrowth, grains of the polycrystalline material grow vertically and laterally from the thin seed region 208 and compete for space. As such, the transition region has numerous grain orientations, sizes and boundaries, wherein the grain sizes are larger than the fine-grained polycrystalline semiconductor. As growth progresses, some grains will grow faster than others. The grains that grow faster in the vertical direction toward the substrate 202 form the columnar region 216, and slower-growing grains are occluded and are prevented from growing further. As such, the columnar region 216 has relatively much larger grains that resemble columns with vertically extending grain boundaries (i.e., columnar) relative to the transition region 214. The grains of the columnar region 216 originate from and are continuous with certain grains in the transition region 214. As such the columnar region 216 has an inherently irregular profile at the interface with the transition region 214.

In some embodiments, the precursor film of the non-single crystal semiconductor material is a polycrystalline semiconductor material instead of an amorphous semiconductor, as mentioned above, for example a fine-grained polycrystalline material. In some of these embodiments, the pulsed laser annealing 120 process may be illustrated as starting at FIG. 2C with the fine-grained polycrystalline region 208 instead of FIG. 2B. When a fine-grained polycrystalline material is used as the precursor film 208, the low thermal budget pulsed laser annealing process 120 includes recrystallization or crystal regrowth to form the polycrystalline layer with distinguishable crystalline regions. In contrast, when the amorphous semiconductor is used as the precursor film 204, the low thermal budget pulsed laser annealing process 120 includes crystallization and may include recrystallization (or crystal regrowth), as described above.

Although not illustrated, during recrystallization of the semiconductor film from the thin seed region, it is possible for the molten semiconductor to also crystallize from an interface with the substrate, leading to a secondary set of crystal grains growing away from the substrate and meeting the primary crystallization grains (transition region and columnar region) that grow towards the substrate. However, secondary crystallization initiated from the substrate involves heterogeneous nucleation and an associated time delay, and would produce a layer of grains that are relatively small compared to those produced by the primary crystallization initiated from the seed region. If such a secondary layer of grains is formed, there will be an associated interface consisting of grain boundaries between the primary and secondary sets of grains where they meet, and this would increase the series resistance through the semiconductor structure in the vertical direction. Some embodiments of the present method 100 may reduce, or in some embodiments may minimize or even prevent, one or both of the likelihood and the extent of such secondary crystallization from the substrate.

Figure 3A:
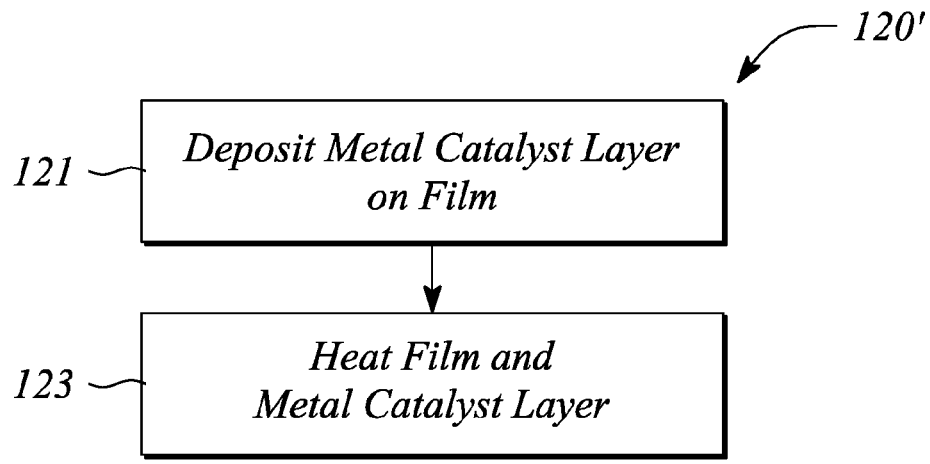
FIG. 3A illustrates a flow chart of a metal catalyzed thermal crystallization process, according to another embodiment of the present invention.

In other embodiments, the low thermal budget annealing 120' comprises a metal catalyzed thermal crystallization 120' of an amorphous semiconductor film. FIG. 3A illustrates a flow chart of a metal catalyzed thermal crystallization 120' process, according to another embodiment of the present invention. The metal catalyzed thermal crystallization 120' comprises forming 121 a layer of a metal catalyst material on the surface of a precursor film of an amorphous semiconductor material, such as a-Si, and heating 123 the amorphous semiconductor film in the presence of the metal catalyst for a period of time to crystallize the film. Moreover, as mentioned above, in some embodiments, the film is one or both of cleaned and degassed prior to annealing 120, 120'.

Figure 3B:
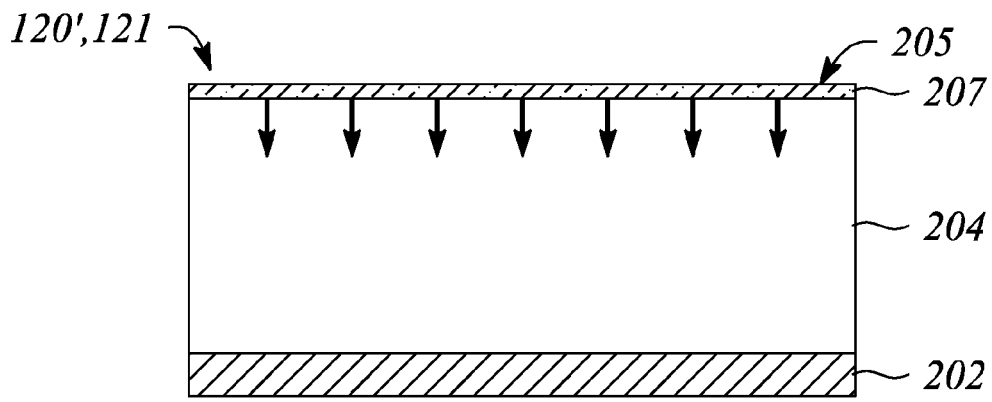
FIGS. 3B-3C illustrate cross sectional views of a portion of a crystalline semiconductor structure being fabricated in accordance with metal catalyzed thermal crystallization of FIG. 3A, according to an embodiment of the present invention.
Figure 3C:
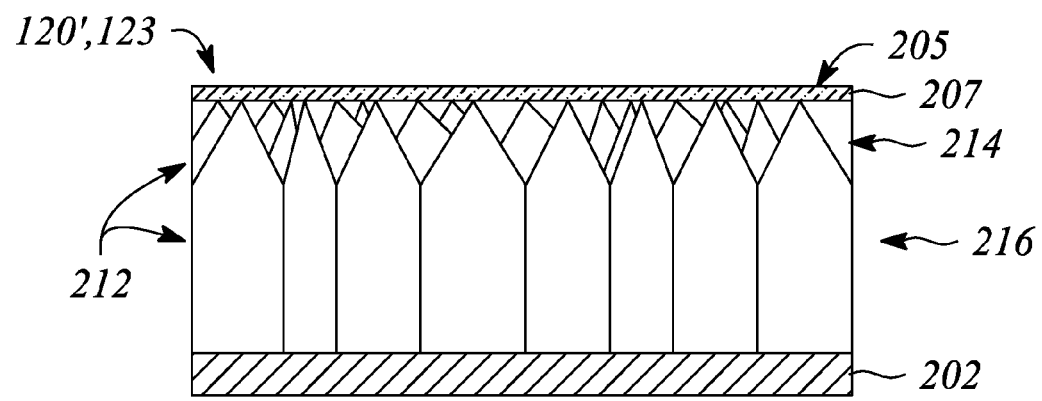

FIG. 3B illustrates a substrate 202 with a film 204 of an amorphous semiconductor material formed 110 thereon and a layer 207 of a metal catalyst on the film 204 at the surface 205. Also illustrated by a downward vertical arrow is the direction of crystallization 120' starting at the interface of the metal catalyst layer 207 in the direction of the substrate 202. FIG. 3C illustrates the metal catalyzed thermal crystallization 120' of the amorphous semiconductor film into a polycrystalline layer 212 that has a transition region 214 adjacent to metal catalyst layer 207 at the surface 205 and a columnar region 216 anchored between the transition region 214 and the substrate 202, as described above.

The metal catalyst for the metal catalyst layer 207 may be any metal that will catalyze crystal growth in the presence of heat much faster than heat alone will catalyze such crystal growth (without a metal catalyst). In some embodiments, the metal catalyst is a metal that does not detrimentally affect one or both of electrical properties and optoelectrical properties of a photonic device made using the method 100 of making a crystalline semiconductor structure. For example, the metal catalyst is selected from nickel (Ni), aluminum (Al), platinum (Pt) or an alloy or combination of any of these metals.

During metal catalyzed thermal crystallization 120', the film 204 is heated 123 in the presence of the metal catalyst layer 207 for a period of time at a relatively low temperature that depends in part on the semiconductor material chosen for the film 204 and the material chosen for the substrate. For example, an amorphous silicon (a-Si) film may be heated 123 (i.e., annealed 120') at a temperature between 200° C. and 450° C. for a period of time ranging from 30 minutes to 10 hours. The length of time that it takes the region 204 crystallize at a particular temperature may be determined using techniques including, but not limited to, etching a test sample or using transmission electron microscopy (TEM). Moreover, the temperature is chosen to reduce, or in some embodiments to minimize or even prevent, potential heat-only catalyzed crystal growth at other interfaces of the amorphous film 204, for example at the substrate interface, as further mentioned below. Heating 123 in the presence of the metal catalyst may be performed in a furnace or oven, for example using a nitrogen environment. The heat source used may include, but is not limited to, one or both of a heat lamp and a low energy laser, for example a continuous wave (CW) laser, for example.

In some embodiments, an upper limit on heating 123 is about 500° C., in other embodiments, the upper limit on heating 123 is about 400° C. for Si, for example. The upper limit on heating 123 depends on several factors, some of which were mentioned above, for example, the semiconductor material chosen, the substrate material chosen, and the metal catalyst chosen. Moreover, in some embodiments, consideration is given to reducing, and in some embodiments, one of minimizing and preventing, secondary crystal growth from other interfaces with the amorphous semiconductor film 204, for example, by metal catalyzed crystallization 120' with a low thermal budget.

The structure formed by metal catalyzed crystallization 120' of the amorphous semiconductor film according to this embodiment is similar to that formed by the crystal regrowth during pulsed laser annealing 120, as described above. A transition region of a polycrystalline layer forms first at an interface with the metal catalyst layer. FIG. 3C illustrates a cross sectional view of the polycrystalline layer 212 on the substrate 202 after crystallization according to an embodiment of the metal catalyzed crystallization 120'. The transition region 214 is a relatively thin horizontal region of small grains and a variety of grain boundaries. The columnar region 216 is anchored between the transition region 214 and the substrate 202. The columnar region 216 is a horizontal region of relatively larger columnar grains defined by substantially parallel grain boundaries that are substantially perpendicular to the horizontal plane of the substrate 202. The larger-grained columnar region 216 is typically much thicker than the small-grained transition region 212. For example, the columnar region 216 may be at least twice as thick as the transition region 214.

Although not illustrated in FIGS. 3B or 3C, metal catalyzed thermal crystallization 120' also includes a possibility of secondary crystal growth that is initiated from the substrate in addition to the primary crystallization initiated from the metal catalyst layer. As mentioned above for pulsed laser annealing 120 of the film, a secondary set of crystal grains growing from the substrate and meeting the primary crystallization grains (both transition region and columnar region) that grow towards the substrate are possible. The mechanism for the secondary crystal growth in the amorphous film at the substrate interface during annealing 120' would be growth catalyzed from one or both of the substrate and an electrode on the substrate surface. Such secondary crystallization initiated at the substrate interface would result in a general microstructure similar to that described above with respect to the possible secondary crystallization during pulsed laser annealing 120. Herein, by 'primary' it is meant that the crystallization or recrystallization adjacent to the surface 205, whether using the metal catalyst layer 207 embodiment (annealing 120') or the fine-grain polycrystalline seed region 208 embodiment (annealing 120), is the expected and intended crystallization according to the present embodiments. In contrast, any crystallization at a substrate interface during the annealing 120, 120' processes is considered a possible side-effect and termed 'secondary' herein.

The method 100 of making a crystalline semiconductor structure further comprises etching 130 the surface to expose the columnar region having an irregular serrated surface. Etching 130 comprises preferentially etching crystal defects, such as grain boundaries and defects within grains. In some embodiments, preferential etching crystal defects comprises one or more of wet chemical etching, vapor chemical etching and plasma etching using a reactive species (e.g., reactive ions) that preferentially attacks grain boundaries. For example, the grain boundaries have unfulfilled crystal bonds that are more susceptible to etching than crystal bonds in the crystal grains. In some embodiments, physical bombardment (e.g., ion milling or sputtering) also may be used to remove material adjacent to grain boundaries more rapidly than material away from the grain boundaries. Examples of preferential etching grain boundaries using wet chemical etching include, but are not limited to, using a solution of $HNO_3$:$HF$:$H_2O$. Examples of preferential etching using dry etching include, but are not limited to, a plasma-based dry etching, for example reactive ion etching (RIE) with sulfur hexafluoride ($SF_6$).

Figure 4:
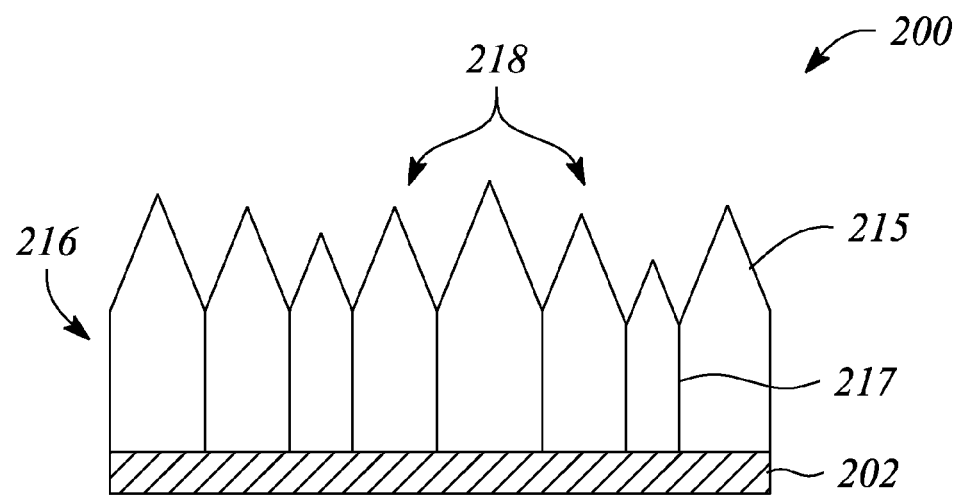
FIG. 4 illustrates a cross sectional view of a portion of the light trapping crystalline semiconductor structure made according to the method of FIG. 1, according to an embodiment of the present invention.

In some embodiments of pulsed laser annealing 120, there may be a fine-grain polycrystalline seed region 208 at the surface 205 (see FIG. 2E) as well as the transition region 214 of the polycrystalline layer 212 adjacent to the fine-grain polycrystalline seed region 208. Since both regions 208 and 214 have numerous small grains and grain boundaries (i.e., defects), the preferential etching will remove substantially all of the fine-grain polycrystalline seed region 208 and the transition region 214 to expose the underlying columnar region 216 of columnar predominantly single-crystal grains. Moreover, the underlying columnar region 216 has an irregular serrated profile adjacent to the transition region 214 that is inherently formed by the random grain sizes and grain boundaries of the transition region 212. Preferential etching of the transition region exposes various tapered shapes of the individual columnar grains at a surface portion of the columnar region 216 that in some embodiments, also accentuates the irregular serrated profile. FIG. 4 illustrates a cross sectional view of a portion of the crystalline semiconductor structure 200 after etching 130, according to an embodiment of the present invention. The crystalline semiconductor structure 200 comprises the columnar region 216 having an irregular serrated surface 218 on a substrate 202. The columnar region 216 comprises relatively large columnar grains 215 delineated or defined by substantially parallel columnar grain boundaries 217 that are substantially perpendicular to the substrate.

The columnar grains 215 are wider at a first or base end adjacent to the substrate than a second or top end at the exposed surface 218. Moreover, the surface 218 of the crystalline semiconductor structure 200 has a variety of tapered shapes, for example, because some columnar grains 215 are taller than others and some columnar grains 215 are wider than others. A variety of heights and widths of the columnar region 216 after etching 130 are illustrated in FIG. 4 by way of example. Moreover, FIG. 4 illustrates that the columnar grains 215 have relatively pointed top ends, by way of example only. In some embodiments, some of the top ends may include a curve, a flat portion or a ridge, for example, that define the irregularity of serrated surface 218. In some embodiments, a height of the columnar grains 215 may range from about 0.5 micron to about several microns; in other embodiments, the columnar grains 215 may range from several microns to 10 microns, or even several tens of microns, for example, depending on the starting thickness of the film 204. In some embodiments, a width of the base end of the columnar grains 215 may range from about 0.5 micron to about 1.5 microns or more, for example.

In other embodiments, there may be a metal catalyst layer 207 at the surface (see FIG. 3C) as well as the transition region 214 of the polycrystalline layer 212 adjacent to the surface 205. In these embodiments, etching 130 the surface further comprises etching the metal catalyst layer 207 before preferential etching of the crystal defects. The metal catalyst layer may be etched, for example, using wet chemical etching or dry etching techniques. For example, dilute nitric acid ($HNO_3$) may be used to wet chemical etch a Ni metal catalyst layer.

Figure 5:
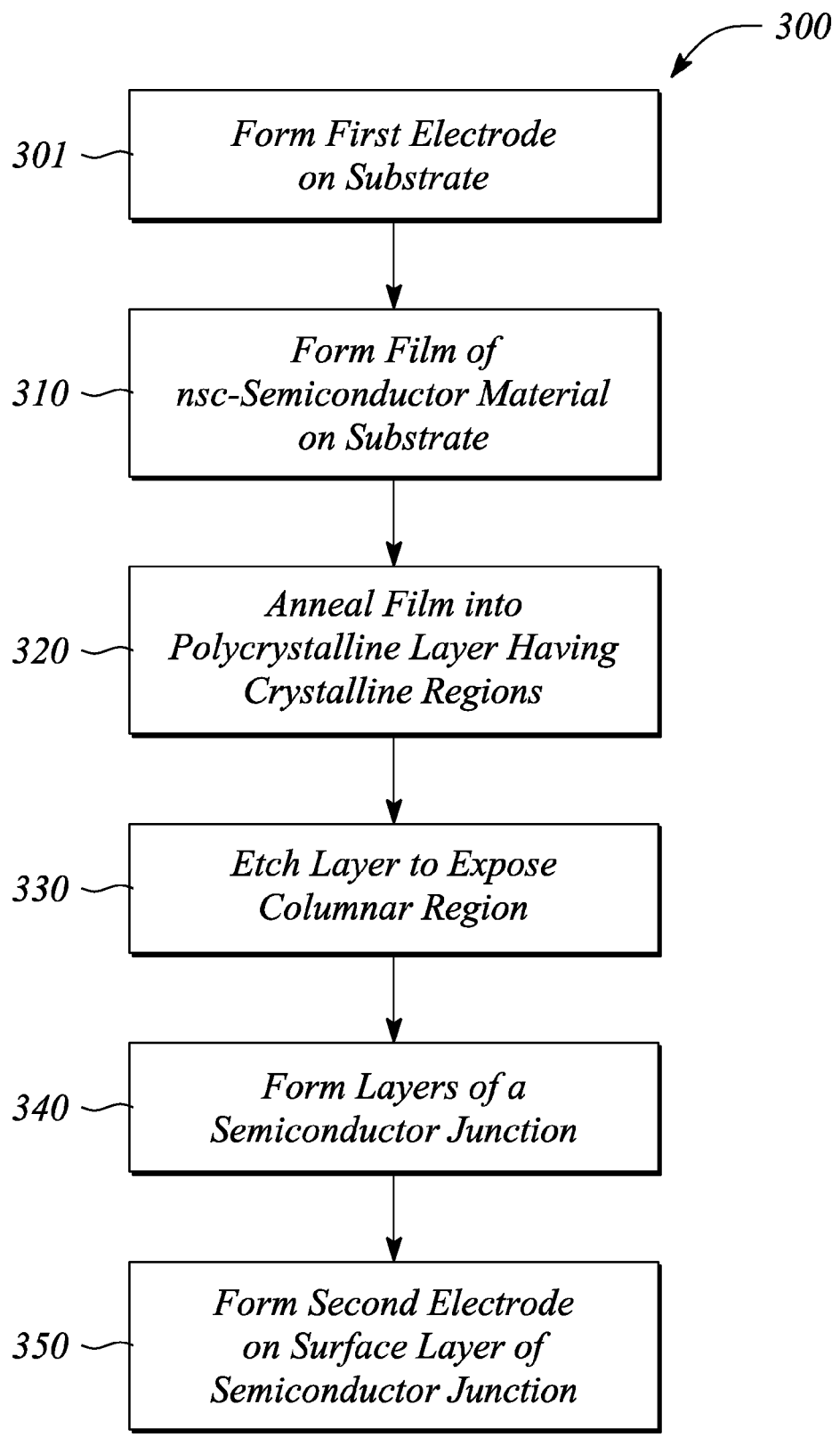
FIG. 5 illustrates a flow chart of a method of fabricating a photonic device, according to another embodiment of the present invention.

In some embodiments, the crystalline semiconductor structure 200 having an irregular serrated surface 218, as described above and illustrated in FIG. 4, is useful in light trapping applications, such as for photonic devices used in photodetection and photovoltaic applications. In some embodiments, a method 300 of making a light trapping semiconductor device (hereinafter 'photonic device') comprises the method 100 of making a crystalline semiconductor structure described above. FIG. 5 illustrates a flow chart of a method 300 of making a photonic device according to an embodiment of the present invention.

The method 300 of making the photonic device comprises forming 301 a first electrode on a substrate. The first electrode also may be referred to herein as a 'substrate electrode' or a 'bottom electrode,' for example, because of its relative location in the photonic device. In some embodiments, the first electrode may be a continuous layer on the substrate surface. In other embodiments, the first electrode may be a plurality of spaced apart first electrode traces (i.e., electrical conduction paths) that may ultimately connect to a common bus. The first electrode is formed 301 on the substrate using any one or more of sputtering, evaporation, chemical vapor deposition, electrodeposition, electroless deposition and printing, for example, and may further include a lithography technique to pattern the first electrode. In other embodiments, the first electrode may be embedded into or partially embedded into the substrate surface, such as by using ion implantation to create heavily doped conductive regions in the surface. The substrate material may be any of the substrate materials described herein, including a low-temperature substrate, as defined herein. In some embodiments, the deposition technique used for forming 301 the first electrode is chosen based on whether a low-temperature substrate is used. Moreover, the pattern of the first electrode (e.g., a continuous layer or a plurality of spaced apart traces) may be dependent on which crystallization process is used on the non-single crystalline film, as described above, for example.

In some embodiments, the first electrode has very low resistivity to facilitate carrier extraction from the photonic device. In these embodiments, the first electrode is selected from the conductive metals or metal oxides provided above for the electrode materials. In some embodiments, forming 301 the first electrode further comprises providing the first common bus that electrically connects to the first electrode and is accessible from outside of the active region of the photonic device. The first common bus may be an electrically conductive metal also selected from the electrode materials provided above.

The method 300 of making a photonic device further comprises forming 310 a film of a non-single crystal semiconductor material on the substrate that covers the first electrode. The semiconductor material may be extrinsically doped, intrinsically doped, or undoped depending on a semiconductor junction to be subsequently formed, as described below. In some embodiments, forming a film 310 is substantially equivalent to forming 110 a film described above for the method 100 of making a crystalline semiconductor structure. The method 300 of making a photonic device further comprises annealing 320, 320' the film into a polycrystalline layer having transition and columnar crystalline regions. In some embodiments, annealing 320, 320' the film is substantially equivalent to any of the embodiments of annealing 120, 120' the film described above for the method 100 of making a crystalline semiconductor structure.

Figure 6:
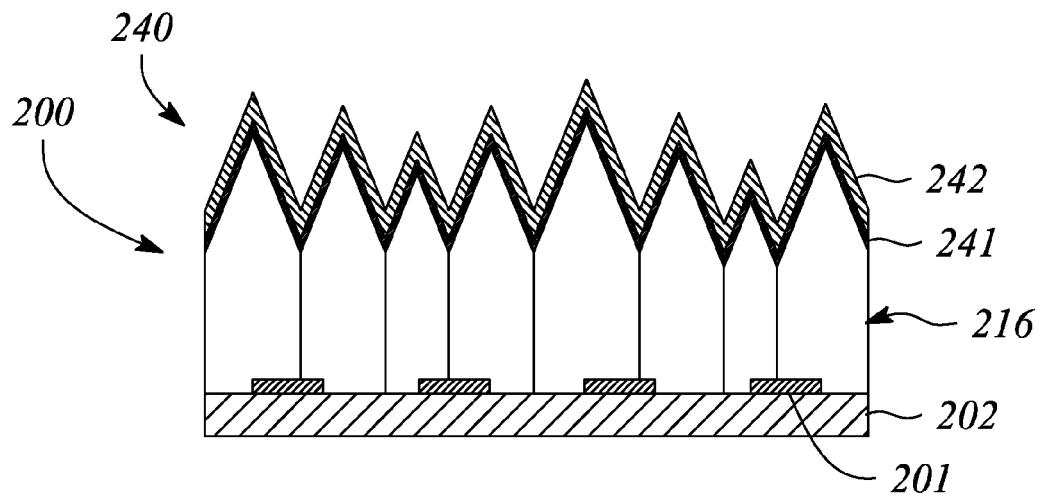
FIG. 6 illustrates a cross sectional view of a portion of the photonic device being fabricated in accordance with the method of FIG. 5, according to another embodiment of the present invention.
Figure 7:
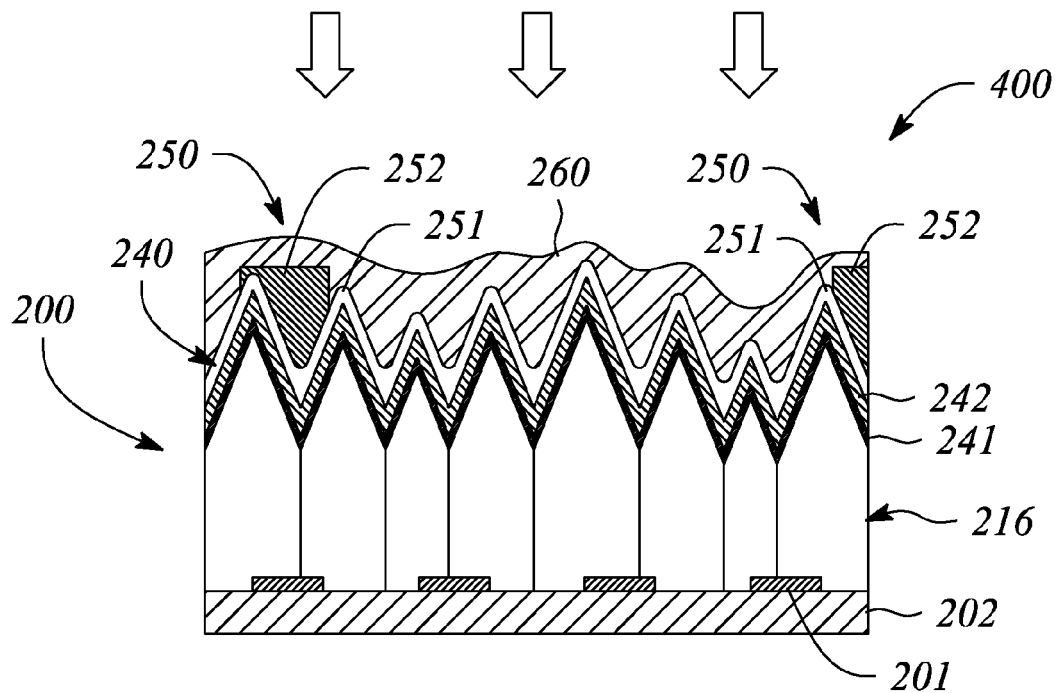
FIG. 7 illustrates a cross sectional view of a portion of a photonic device fabricated in accordance with the method of FIG. 5, according to an embodiment of the present invention.

Moreover, the method 300 of making a photonic device further comprises etching 330 a surface of the polycrystalline layer to expose the columnar region having an inherently irregular profile due to the method 300 of forming the polycrystalline layer. In some embodiments, etching 330 the surface of the polycrystalline layer is equivalent to any of the embodiments of etching 130 the surface of the polycrystalline layer to expose the columnar region having an inherently irregular profile described above for the method 100 of making a crystalline semiconductor structure. The crystalline semiconductor structure 200 that is illustrated in FIG. 4 results. However, not illustrated in FIG. 4 is a first electrode that was formed 301 according to the method 300 of fabricating a photonic device. A first electrode 201 between the crystalline semiconductor structure 200 and a substrate is illustrated in FIGS. 6-7, which are described below.

The method 300 of making a photonic device further comprises forming 340 layers of a semiconductor junction on the irregular serrated surface; and forming 350 a second electrode on a surface layer of the semiconductor junction. In some embodiments, the semiconductor junction comprises one or more conformal layers of a junction material to form 340 a conformal semiconductor junction. The formed 340 conformal semiconductor junction conforms to a topography of the irregular serrated surface, such that contours of the irregular serrated surface are substantially retained.

The conformal semiconductor junction is formed 340 comprising depositing a layer of a junction material on the irregular serrated surface of the crystalline semiconductor structure. In some embodiments, the junction material layer is a metal to form a Schottky junction with the crystalline semiconductor structure; in some embodiments, the junction material layer may further comprise a semiconductor layer between the crystalline semiconductor structure and the metal layer of the Schottky junction. In other embodiments, the junction material layer is a semiconductor layer that is deposited on the irregular serrated surface to form a conformal p-n junction with the crystalline semiconductor structure. In other embodiments, more than one semiconductor layers are deposited sequentially on the irregular serrated surface to form a conformal p-i-n junction with the crystalline semiconductor structure. In some embodiments, the dopants for the respective conformal semiconductor layer of the junction are added during deposition or growth as the conformal layers are formed 340. Using respective intrinsic or extrinsic materials during forming 340 the conformal layers may be compatible with using low-temperature substrates and maintaining an overall low effective maximum temperature during fabrication.

In other embodiments, the dopants in one or more of the conformal layers are added after one or more of the conformal layers are formed. In some embodiments, the dopants for the conformal semiconductor junction may be injected by diffusion from a solid, liquid, or vapor source in contact with the respective surface of one or both the crystalline semiconductor structure and the respective conformal semiconductor layer. In some embodiments, the dopants for the conformal semiconductor junction are injected by ion implantation doping of one or both of the crystalline semiconductor structure and respective conformal semiconductor layer. Whether doping after forming 340 the conformal layers of the semiconductor junction is available depends on whether a low effective maximum temperature can be maintained when a low-temperature substrate is used. In some embodiments, the semiconductor junction is formed 340 in a surface region of the crystalline semiconductor structure using diffusion of dopants or ion implantation doping directly into the surface region.

In some embodiments, a depletion region of the semiconductor junction is spaced from the surface of crystalline semiconductor structure in case one or both of an individual columnar grain and the tapered surface thereof has defects. In some embodiments, the depletion region is moved by first depositing an initial semiconductor conformal layer on the irregular serrated surface, wherein the initial semiconductor conformal layer may have the same conductivity type as the crystalline semiconductor structure. Then, for example, either another semiconductor layer comprising an opposite conductivity type or a metal layer is deposited on the initial semiconductor layer to form p-n junction or a Schottky junction, respectively. The respective junction is adjacent to, but not in or with, the crystalline semiconductor structure or its surface. In the case of the Schottky junction, at least the initial semiconductor conformal layer is lightly doped (e.g., an intrinsic region) or at most, is moderately doped, for example. In another example, after the initial semiconductor layer of the same conductivity type as the crystalline semiconductor structure is deposited on the irregular serrated surface, then each of an intrinsic semiconductor layer (i-region) and an n-doped semiconductor layer are formed on the initial semiconductor layer to form a p-i-n junction adjacent to, but not in or directly with a surface region of the crystalline semiconductor structure.

In some embodiments, the crystalline semiconductor structure comprises an extrinsic first semiconductor material of a first conductivity or a first dopant type. In some embodiments, the crystalline semiconductor structure either may be lightly doped or comprise an intrinsic region at the irregular serrated surface. In some embodiments, the layer of semiconductor material comprises an extrinsic second semiconductor material of a second conductivity type (or a second dopant type) that is opposite or the reverse of the first conductivity type. For example, the crystalline semiconductor structure may comprise a p-type dopant; the transition region may be p+-type dopant, while the deposited junction layer of the conformal semiconductor junction comprises a semiconductor layer doped with an n-type dopant to form a p-n junction. In some embodiments, forming a conformal layer of a junction material to form 340 the conformal semiconductor junction comprises depositing a layer of an intrinsic or moderately doped semiconductor material on the surface of the crystalline semiconductor structure and further forming a layer of the second extrinsic semiconductor material on the intrinsic or moderately doped semiconductor layer to form a p-i-n junction with the crystalline semiconductor structure.

In some embodiments, the first semiconductor material (i.e., of the crystalline semiconductor structure) and the second semiconductor material (i.e., of the deposited junction layer) may be the same, while the degree of crystallinity may be the same or different. For example, the crystalline semiconductor structure is predominantly single-crystal grains formed from a polycrystalline silicon layer, while the deposited semiconductor layer of the conformal semiconductor junction may extend the crystal structure of the underlying silicon grains. In another example, the first semiconductor material (i.e., of the crystalline semiconductor structure) and the second semiconductor material (i.e., of the deposited junction layer) may be the same, while the first semiconductor material is predominantly single-crystal grains of a polycrystalline material (e.g., polycrystalline silicon) and the second semiconductor material is amorphous (e.g., amorphous silicon). In this example, the amorphous material (i.e., the amorphous silicon) has a different bandgap than polycrystalline material (i.e., the polycrystalline silicon). In another example, one of the semiconductor materials may be germanium while the other is silicon or an alloy of Si and Ge.

In some embodiments, the conformal layer(s) may be initially deposited as an amorphous phase, and then annealed with a low thermal budget by a furnace or a laser beam to respectively induce solid-phase or melt-phase crystallization seeded from the crystalline semiconductor structure. In some of the above embodiments, this annealing and crystallization method does not elevate the temperature of the substrate above its damage threshold (e.g., 450° C. for selected types of glass), allowing the integration of these structures onto substrates with relatively low tolerance to thermal exposure, which may be defined as melting temperature or softening or warping temperature. In other embodiments, depositing a conformal layer of a junction material (i.e., a semiconductor or a metal) comprises growing the layer on the irregular serrated surface using a chemical vapor deposition technique, for example vapor phase epitaxy (VPE), or plasma enhanced chemical vapor deposition (PECVD), or by molecular beam epitaxy (MBE), such that an epitaxial connection with the crystalline semiconductor structure is formed. The technique chosen may depend on whether a low-temperature substrate is chosen for the photonic device.

FIG. 6 illustrates a cross sectional view of a portion of the light trapping crystalline semiconductor device (i.e., photonic device) being fabricated in accordance with the method 300 of FIG. 5, according to another embodiment of the present invention. A plurality of first electrode 201 traces spaced apart on the substrate 202 are illustrated in FIG. 6 by way of example, according to an embodiment of the present invention. The first electrode 201 traces electrically connect to a first common bus (not illustrated) adjacent to an end of the first electrode 201 traces. In other embodiments, the substrate 202 itself is also the first electrode 201 (not illustrated) and therefore, an additional electrode material for a first electrode is unnecessary.

Moreover, FIG. 6 illustrates two conformal layers 241, 242 on the crystalline semiconductor structure 200 that conform to the irregular serrated profile of the structure 200, by way of example. The exemplary two conformal layers 241, 242 may form a conformal p-i-n semiconductor junction 240 with the crystalline semiconductor structure 200 in some embodiments. In other embodiments, the exemplary two conformal layers 241, 242 may be a p-n junction 240 or a Schottky junction 240 that is adjacent to the surface of the crystalline semiconductor structure 200, but with a depletion region spaced from the structure 200, as discussed above. In still another embodiment, one layer 241 of the two conformal layers may be part of a p-n junction 240 or a Schottky junction 240 directly on and with the crystalline semiconductor structure 200 and the other layer 242 of the two conformal layers may be a conformal second electrode layer on the surface layer 241 of the semiconductor junction 240, as further described below.

The method 300 of making further comprises forming 350 a second electrode on a surface layer of the conformal semiconductor junction. The second electrode is defined as an electrode that electrically accesses the crystalline semiconductor structure 200 from the irregular serrated surface. In contrast, the first electrode electrically accesses the crystalline semiconductor structure 200 from the wide base end of the columnar grains adjacent to the substrate. The second electrode may be referred to herein as a 'top electrode' or 'surface electrode' because of its relative location in the photonic device. In some embodiments where the photonic device being fabricated comprises a Schottky junction, the metal layer of the Schottky junction may also function as a second electrode layer. In some embodiments, one or both of the first electrode and the second electrode is optically transparent, as defined above.

In some embodiments, forming 350 the second electrode comprises depositing a conformal layer of a second electrode material on the surface layer of the semiconductor junction. FIG. 7 illustrates a cross sectional view of a portion of a photonic device 400 fabricated using the method 300, according to an embodiment of the present invention. The photonic device 400 comprises a first electrode 201 on a substrate 202 and a crystalline semiconductor structure 200 on the first electrode 201 and the substrate 202. A semiconductor junction 240 is formed on the crystalline semiconductor structure 200 and maintains the irregular serrated contours of the crystalline semiconductor structure 200.

FIG. 7 further illustrates that the photonic device 400 further includes a second electrode 250 adjacent to a surface layer of the conformal semiconductor junction 240 according to an embodiment of the present invention. In some embodiments, the second electrode 250 comprises a conformal layer 251 of a second electrode material directly on the surface conformal layer 242 of the semiconductor junction 240. The semiconductor junction 240 may be any of the junctions described above. The conformal second electrode layer 251 maintains an undulating surface of conformal semiconductor junction 240 created by the irregular serrated topography of the crystalline semiconductor structure 200. In other embodiments (not illustrated), the second electrode may be provided by depositing a layer of a second electrode material that partially conforms to the undulating surface, instead of a conformal layer, such that the undulating surface is less prominent. The second electrode layer 251 is electrically conductive and in some embodiments, provides optical transparency. Any of the electrode materials provided above may be used for the conformal second electrode layer 251. The second electrode conformal layer 251 may be formed 350 using one or more of the deposition methods mentioned above for the first electrode or the conformal junction layers that are compatible with one or more embodiments of the fabrication of the photonic device 400 described herein.

In some embodiments, forming 350 a second electrode further comprises providing a plurality of spaced apart second electrode traces (conduction paths) on and electrically connected to the conformal second electrode layer. FIG. 7 further illustrates two spaced apart second electrode traces 252 of the plurality on the conformal second electrode layer 251 by way of example. The second electrode traces 252 are highly conductive electrode paths that extend across the photonic device 400 to facilitate carrier extraction from the conformal second electrode layer 251 out of the photonic device. In some embodiments, the second electrode traces 252 are narrow in width to reduce obstruction of the optical path (illustrated as large arrows in FIG. 7) of the photonic device 400. In some embodiments, the second electrode traces 252 are thicker (taller in height) than the conformal second electrode layer 251 to facilitate reducing resistance of the second electrode 250.

The combination of a conformal second electrode layer 251 and a plurality of spaced apart second electrode traces 252 ultimately provide lower resistance paths for carrier extraction from the semiconductor junction 240 of the photonic device 400. Any of the materials provided above for the electrode materials may be used for the plurality of second electrode traces 252. In some embodiments, the second electrode traces 252 are an electrically conductive metal (i.e., metallic strips) or a highly doped semiconductor material. In some embodiments, the second electrode traces 252 are also optically transparent. In some embodiments, the conformal layer 251 of the second electrode 250 is an inherently optically transparent material (e.g., ITO) and the plurality of spaced apart second electrode traces 252 may be any of the electrode materials, for example.

The second electrode 250 electrically connects to a second common bus (not illustrated) that is outside of the optical path of the photonic device 400. In some embodiments, forming 350 the second electrode further comprises providing the second common bus that electrically connects to the second electrode outside of the optical path. The second common bus may be selected from the electrode materials provided above. For example, the second common bus may be any of the electrically conductive metals.

In some embodiments of the photonic device (not illustrated), the optical path is from the backside of a substrate instead of or in addition to the optical path illustrated in FIG. 7. For example, the crystalline semiconductor structure may comprise Si and the junction layers may comprise Ge. Moreover, the light may be near-IR light, for example, and incident on the backside of the substrate so that the light is transmitted by the crystalline Si structure and absorbed near the top surface (near the irregular serrated profile) by the Ge junction layers. The irregular serrated profile is then effective in increasing the absorption of the near-IR light compared to a flat surface. In this example, the second electrode may or may not be optically transparent, while the substrate and effectively, the first electrode, are optically transparent.

In some embodiments, the method 300 of making a photonic device further comprises applying a passivation layer to cover the second electrode and thus, protect the active region of the photonic device. The passivation layer protects the underlying active region from dust, debris, moisture as well as other device degrading chemicals (e.g., oxygen), for example. In some embodiments, the passivation layer provides a hermetic seal to protect the photonic device from moisture. FIG. 7 further illustrates a passivation layer 260 adjacent to the second electrode 250 of the photonic device 400. The passivation layer 260 encapsulates the surfaces of the photonic device 400 according to an embodiment of the present invention. In some embodiments, the passivation layer further covers the second common bus (not illustrated). The passivation layer 260 comprises an electrically insulating material including, but not limited to silicon nitride, silicon oxide and doped silicon oxide. In some embodiments, such as the embodiment illustrated in FIG. 7, the passivation layer 260 is also optically transparent. In some embodiments, the passivation layer may further comprise antireflective characteristics.

In some embodiments, the method 300 of making a photonic device further comprises cleaning the irregular serrated surface of the crystalline semiconductor structure after preferentially etching the surface but before forming 340 the conformal semiconductor junction. Cleaning the surfaces comprises one or both of a wet chemical cleaning technique and a plasma cleaning technique to remove any residue and any surface damage caused by the preferential etching. Wet chemical cleaning depends on the materials to be cleaned. For example, for wet chemical cleaning of silicon, one or more of a solution of ammonium hydroxide:hydrogen peroxide ($NH_4OH:H_2O_2$), a solution of sulfuric acid:hydrogen peroxide ($H_2SO_4:H_2O_2$), and a solution of hydrochloric acid:hydrogen peroxide ($HCl:H_2O_2$) may be used. In some embodiments, wet chemical cleaning may further include a hydrofluoric acid (HF) etch of native oxides, for example. In some embodiments, plasma cleaning comprises using oxygen plasma or argon plasma, for example.

The photonic device 400 illustrated in FIG. 7 may be either a photodetector or a photovoltaic (solar) cell, depending on the embodiment. A plurality of the photonic devices 400 may be connected in one or both of series and parallel to form a solar array, for example. The photodetector may be used as an optical sensor. The photonic device fabricated on a large area substrate, according to some embodiments, provides a lower cost device with at least comparable energy conversion efficiency to some higher cost single-crystal photonic devices. Moreover, a low-temperature substrate may be used in accordance with various embodiments herein that further may lower the cost of both the materials as well as the manufacturing of the photonic device. As such, some of the photonic device embodiments of the present invention may be used in applications not previously considered due to cost constraints.

In some embodiments (not illustrated), the photonic device as described above may serve as a support or 'first device layer' for the fabrication of one or more other device layers stacked on top of the photonic device. A device comprising multiple device layers of columnar grains as described herein is an embodiment of a multilayer heterojunction photonic device (e.g., a multilayer heterojunction photovoltaic device) that is designed to generate power from a greater region of the solar spectrum.

In another embodiment (not illustrated) of making a photonic or light trapping semiconductor device, a sacrificial substrate is used to support a polycrystalline layer having a transition region and a columnar grain region. The transition region is formed adjacent to the substrate and the columnar region is formed on the transition region adjacent to a surface of the polycrystalline layer, as described in the co-pending International Patent Application No. PCT/US09/42403, cited above. As such, the sacrificial substrate may or may not be a low-temperature substrate for this embodiment. A layer-transfer technique is used to attach the columnar region of the polycrystalline layer to a substrate that has a first electrode formed thereon. For example, a wafer bonding technique may be used. In some embodiments, the surface of the columnar region may be made smooth, for example by chemical-mechanical polishing (CMP) before the bonding process. The sacrificial substrate and the transition region are removed, for example by etching, after the polycrystalline layer is transferred. The inherently irregular serrated profile of the columnar region is exposed by the removal of the sacrificial substrate and the transition region to form a 'crystalline semiconductor structure', as described above. In some embodiments, the conformal layers are then formed on the irregular serrated surface to form a conformal semiconductor junction. A second electrode is then formed, as described above for the method 300 of making a photonic device.

Thus, there have been described embodiments of a method of making a crystalline semiconductor structure and a photonic device made with the crystalline semiconductor structure using a low thermal budget annealing process on large area substrates that may also be low-temperature substrates. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A method of making a crystalline semiconductor structure, the method comprising:
forming a film of a non-single crystal semiconductor material on a substrate, the film having a surface;
annealing the film with a low thermal budget process to form a polycrystalline layer that comprises a transition region adjacent to the surface and a relatively thicker columnar region between the transition region and the substrate, wherein the transition region comprises small grains with random grain boundaries, the columnar region comprising relatively larger columnar grains defined by substantially parallel grain boundaries that are substantially perpendicular to the substrate; and
etching the surface to expose the columnar region having an irregular serrated surface.

2. The method of claim 1, wherein the non-single crystal semiconductor material is either an amorphous semiconductor or a polycrystalline semiconductor.

3. The method of claim 1, wherein the substrate is a low-temperature substrate, the low thermal budget process being compatible with a thermal stability of the substrate.

4. The method of claim 1, wherein annealing the film comprises irradiating the film through a backside of the substrate using a short laser pulse, the substrate being transparent to a wavelength of the laser pulse.

5. The method of claim 4, wherein the film is a fine-grained polycrystalline semiconductor, and wherein irradiating the film comprises:
melting a portion of the film; and
recrystallizing the film from adjacent to the surface, the recrystallization forming the transition region and columnar region of the polycrystalline layer.

6. The method of claim 5, wherein the portion of the film is either all of the film or all of the film except a relatively thin continuous surface portion.

7. The method of claim 4, wherein the film is an amorphous semiconductor, and wherein irradiating the film comprises:
crystallizing the film into a layer of fine grained polycrystalline semiconductor;
melting the fine grained polycrystalline semiconductor layer except a relatively thin continuous surface portion; and
recrystallizing the melted layer using the surface portion to seed crystal regrowth, the recrystallization forming the transition region and columnar region of the polycrystalline layer.

8. The method of claim 7, wherein the laser pulse has a time-varying pulse intensity, a leading edge of the pulse intensity crystallizing the film, a following portion of the pulse intensity melting most of the layer, a duration of the laser pulse ranging from several nanoseconds to several hundred nanoseconds.

9. The method of claim 1, wherein annealing a film comprises:

depositing a metal catalyst layer on the surface of the film, the film being an amorphous semiconductor; and heating the film in the presence of the metal catalyst layer at a temperature and for a period of time to crystallize the amorphous semiconductor film into the polycrystalline layer, wherein etching the surface comprises etching away the metal catalyst layer and preferentially etching grain boundaries to remove the transition region to expose the irregular serrated surface of the columnar region.

10. The method of claim 9, wherein the film is heated to a temperature that is between about 300° C. and about 500° C. for low-temperature glass substrates for a period of time ranging from about 1 hour to about 8 hours.

11. The method of claim 1, wherein etching the surface comprises preferentially etching the grain boundaries of the transition region until tapered portions of the columnar grains are exposed.

12. A method of making a light trapping device comprising the method of claim 1, wherein the exposed columnar region comprises single-crystal columnar grains having irregular serrated surfaces, and the method further comprising:

forming a first electrode on the substrate before forming a film of a non-single crystal semiconductor material, the film being formed on the first electrode;

forming one or more layers on the irregular serrated surfaces to form a semiconductor junction on or with the columnar grains; and forming a second electrode layer on a surface layer of the semiconductor junction.

13. A method of making a photonic device comprising:

forming a first electrode on a substrate;

forming a film of an extrinsic non-single crystal semiconductor on the substrate and the first electrode;

annealing the film with a low thermal budget process to form a polycrystalline layer that comprises a transition region and a columnar region between the transition region and the substrate, wherein the transition region comprises small grains with random grain boundaries, the columnar region comprising a variety of relatively larger columnar grains defined by substantially parallel grain boundaries that are substantially perpendicular to the substrate;

preferentially etching the grain boundaries to expose the columnar region having an irregular serrated surface;

forming conformal layers of a semiconductor junction on the irregular serrated surface; and forming a second electrode on a surface layer of the semiconductor junction, the photonic device substantially retaining the irregular serrated surface.

14. The method of claim 13, wherein annealing the film comprises either:

irradiating the film through a backside of the substrate using a short laser pulse, the substrate being transparent to a wavelength of the laser pulse to one or both crystallize and recrystallize the film, or heating the film in the presence of a metal catalyst layer on a surface of the film for a period of time to crystallize the film, wherein the metal catalyst layer is removed prior to or simultaneously with preferentially etching the grain boundaries.

15. A method of making a crystalline semiconductor structure, the method comprising:

forming a film of a non-single crystal semiconductor material on a substrate, the film having a surface;

annealing the film with a low thermal budget process to form a polycrystalline layer that comprises a transition region adjacent to the surface and a relatively thicker columnar region between the transition region and the substrate, wherein the transition region comprises small grains with random grain boundaries, the columnar region comprising relatively larger columnar grains defined by substantially parallel grain boundaries that are substantially perpendicular to the substrate; and etching the surface to expose the columnar region having an irregular serrated surface, wherein the film is a fine-grained polycrystalline semiconductor, and wherein annealing the film comprises:

melting a portion of the film; and recrystallizing the film from adjacent to the surface, the recrystallization forming the transition region and the columnar region of the polycrystalline layer.

16. A method of making a crystalline semiconductor structure, the method comprising:

forming a film of a non-single crystal semiconductor material on a substrate, the film having a surface;

annealing the film with a low thermal budget process to form a polycrystalline layer that comprises a transition region adjacent to the surface and a relatively thicker columnar region between the transition region and the substrate, wherein the transition region comprises small grains with random grain boundaries, the columnar region comprising relatively larger columnar grains defined by substantially parallel grain boundaries that are substantially perpendicular to the substrate; and etching the surface to expose the columnar region having an irregular serrated surface, wherein the film is an amorphous semiconductor, and wherein annealing the film comprises:

crystallizing the film into a layer of fine grained polycrystalline semiconductor;

melting the fine grained polycrystalline semiconductor layer except a relatively thin continuous surface portion; and recrystallizing the melted layer using the surface portion to seed crystal regrowth, the recrystallization forming the transition region and the columnar region of the polycrystalline layer.

17. A method of making a crystalline semiconductor structure, the method comprising:

forming a film of a non-single crystal semiconductor material on a substrate, the film having a surface;

annealing the film with a low thermal budget process to form a polycrystalline layer that comprises a transition region adjacent to the surface and a relatively thicker columnar region between the transition region and the substrate, wherein the transition region comprises small grains with random grain boundaries, the columnar region comprising relatively larger columnar grains defined by substantially parallel grain boundaries that are substantially perpendicular to the substrate; and etching the surface to expose the columnar region having an irregular serrated surface, wherein annealing a film comprises:

depositing a metal catalyst layer on the surface of the film, the film being an amorphous semiconductor; and heating the film in the presence of the metal catalyst layer at a temperature and for a period of time to crystallize the amorphous semiconductor film into the polycrystalline layer, wherein etching the surface comprises etching away the metal catalyst layer and preferentially etching grain boundaries to remove the transition region to expose the irregular serrated surface of the columnar region.

18. A method of making a photonic device comprising:
forming a first electrode on a substrate;
forming a film of an extrinsic non-single crystal semiconductor on the substrate and the first electrode;
annealing the film with a low thermal budget process to form a polycrystalline layer that comprises a transition region and a columnar region between the transition region and the substrate, wherein the transition region comprises small grains with random grain boundaries, the columnar region comprising a variety of relatively larger columnar grains defined by substantially parallel grain boundaries that are substantially perpendicular to the substrate;
preferentially etching the random grain boundaries to expose the columnar region having an irregular serrated surface;
forming conformal layers of a semiconductor junction on the irregular serrated surface; and
forming a second electrode on a surface layer of the semiconductor junction, the photonic device substantially retaining the irregular serrated surface,
wherein annealing the film comprises one of:
irradiating the film of fine-grained polycrystalline semiconductor through a backside of the substrate using a short laser pulse to melt a portion of the film and to recrystallize the film from adjacent to the surface;
irradiating the film of an amorphous semiconductor through a backside of the substrate using a short laser pulse to crystallize the film into a layer of fine grained polycrystalline semiconductor, to melt the fine grained polycrystalline semiconductor layer except a relatively thin continuous surface portion, and to recrystallize the melted layer using the surface portion to seed crystal regrowth; and
depositing a metal catalyst layer on the surface of the film of an amorphous semiconductor; and heating the film in the presence of the metal catalyst layer at a temperature and for a period of time to crystallize the amorphous semiconductor film into the polycrystalline layer, wherein preferentially etching the grain boundaries further comprises etching away the metal catalyst layer.

* * * * *